United States Patent [19]

Watanabe et al.

[11] Patent Number: 5,028,972
[45] Date of Patent: Jul. 2, 1991

[54] SOLID STATE IMAGE SENSING DEVICE

[75] Inventors: Kazunari Watanabe; Hiroshi Nozawa, both of Yokohama, Japan

[73] Assignee: Kabushiki Kaisha Toshiba, Kawasaki, Japan

[21] Appl. No.: 239,610

[22] Filed: Sep. 1, 1988

[30] Foreign Application Priority Data

Sep. 4, 1987 [JP] Japan .................. 62-221279

[51] Int. Cl.⁵ .................. H01L 27/14; H01L 31/00
[52] U.S. Cl. .................. 357/30; 357/24; 357/32
[58] Field of Search .................. 357/30 S, 30 H, 30 G, 357/30 D, 30 L, 24 LR, 67 S, 71 S, 32, 71, 24

[56] References Cited

U.S. PATENT DOCUMENTS

| | | | |
|---|---|---|---|
| 3,833,919 | 9/1974 | Naber | 357/715 |
| 4,621,275 | 11/1986 | Ueno et al. | 357/24 LR |
| 4,641,169 | 2/1987 | Inuiya | 357/24 LR |
| 4,912,537 | 3/1990 | Boyd | 357/24 LR |

FOREIGN PATENT DOCUMENTS 0014749 1/1986 Japan .................. 357/30 L

OTHER PUBLICATIONS

"A Half Inch Size . . . Silicon", Chikamura et al., Central Research Lab., 1984.

Primary Examiner—Michael C. Wimer
Assistant Examiner—Minhloan Tran
Attorney, Agent, or Firm—Foley & Lardner

[57] ABSTRACT

In a solid state image sensing device comprising: a semiconductor substrate; a photosensitive pixel area disposed on the semiconductor substrate for generating signal charges in response to incident light and storing the signal charges; a charge transfer area disposed adjacent to the photosensitive pixel area for transferring the signal charges stored in the photosensitive pixel area; and a transfer electrode provided above the charge transfer area, the solid state image sensing device comprises: a high melting temperature metal layer composed of molybdenum silicide MoSi formed above the transfer electrode and an insulating layer having ample thickness formed between the high melting temperature metal layer and the transfer electrode. The light shielding efficiency can be improved and occurrence of a smear phenomenon can be prevented in the resulting device.

7 Claims, 4 Drawing Sheets

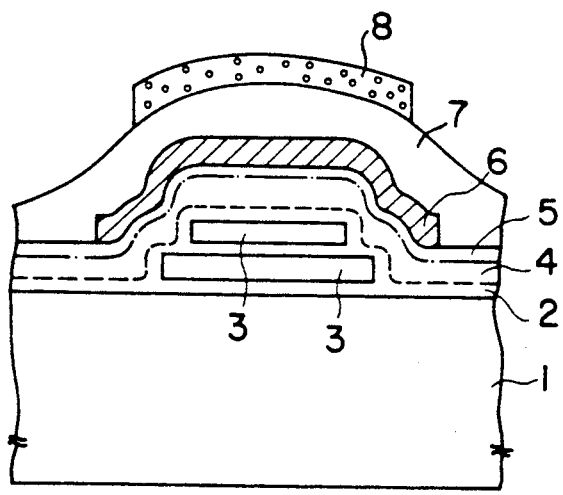
F I G. 1
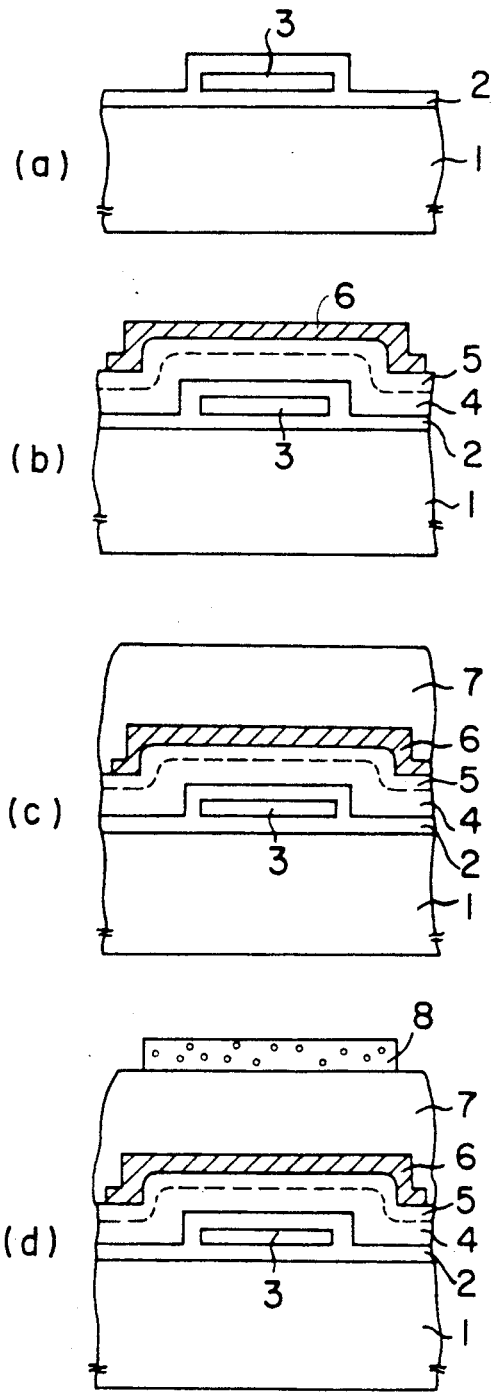
F I G. 2

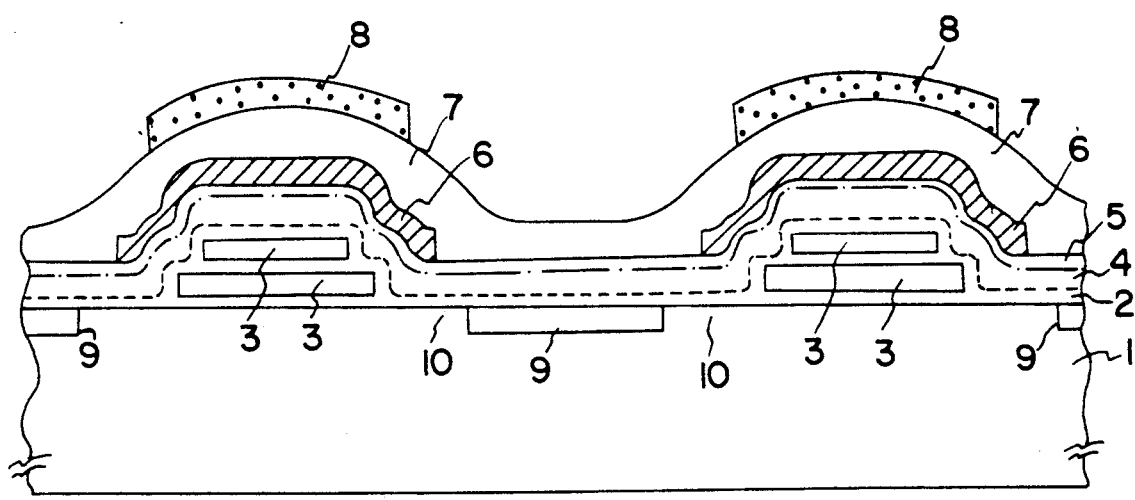
F I G. IA

SOLID STATE IMAGE SENSING DEVICE

BACKGROUND OF THE INVENTION

The present invention relates to a solid state image sensing device, more particularly to a solid state image sensing device with reduced occurrence of smear phenomenon, and also to a method of manufacturing the same.

Generally, in solid state image sensing devices, signal charges corresponding to an image focussed on light receiving surfaces of solid state image sensing elements disposed in a matrix fashion are sampled from photosensitive pixel areas of the solid state image sensing elements, and the sampled signal charges are transferred to charge transfer areas to time-sequentially output image signals to a TV monitor or the like. It is therefore necessary for the charges generated in a semiconductor substrate by photoelectric conversion to be separated for each pixel. Thus, each pixel must be optically separated.

In one example of a conventional solid state image sensing device wherein each pixel is optically separated, a photosensitive pixel area and a charge transfer area are formed on the surface of a semiconductor substrate. A light shielding layer of aluminum Al or aluminum silicide Al-Si is formed above the charge transfer area with an insulating layer interposed therebetween. This device is fabricated in the following manner.

A photosensitive pixel area (not shown) and a charge transfer area (not shown) are formed on the surface of a semiconductor substrate, and thereafter, a transfer electrode of a polysilicon layer is so formed above the charge transfer area that an oxide film formed on the semiconductor substrate through thermal oxidation is interposed between the transfer electrode and the surface of the semiconductor substrate. Further, an oxide film is formed on the transfer electrode through thermal oxidation. Next, an insulating layer is deposited over the entire surface by a chemical vapor deposition (CVD) method and thereafter, phosphorus is diffused into the insulating layer. A light shielding layer of aluminum Al or aluminum silicide Al-Si is formed on the insulating layer above the transfer electrode.

As noted above, conventional solid state image sensing devices are accompanied by a problem of a smear phenomenon due to oblique incident lights or the like. Suppressing the smear phenomenon with the conventional methods produces other problems such as insufficient sensitivity and "white scratch" defects.

SUMMARY OF THE INVENTION

The present invention has been made in view of the above circumstances, and it is an object of the present invention to provide a solid state image sensing device and a method of manufacturing the same by which occurrence of a smear phenomenon can be prevented by improving the light shielding efficiency without incurring insufficient sensitivity and "white scratch" defects.

According to the present invention in one aspect thereof in a solid state image sensing device comprising a semiconductor substrate, a photosensitive pixel area disposed on the semiconductor substrate for generating signal charges in response to incident light and storing the signal charges, a charge transfer area disposed adjacent to the photosensitive pixel area for transferring the signal charges stored in the photosensitive pixel area, and a transfer electrode provided above the charge transfer area, the solid state image sensing device comprises a high melting temperature metal layer such as molybdenum silicide MoSi, titanium silicide TiSi or tungsten silicide WSi formed above the transfer electrode and an insulating layer having ample thickness formed between the high melting temperature metal layer and the transfer electrode.

According to the present invention, in another aspect thereof, there is provided a method of manufacturing a solid state image sensing device which comprises the steps of: forming a photosensitive pixel area and a charge transfer area on the surface of a semiconductor substrate; forming a first insulating layer on the semiconductor substrate; forming a transfer electrode on the first insulating layer above the charge transfer area; forming a second insulating layer having ample thickness at least above the charge transfer area; forming a high melting temperature metal layer such as molybdenum silicide MoSi, titanium silicide TiSi or tungsten silicide WSi on the second insulating layer above the charge transfer area; and forming a third insulating layer on the high melting temperature metal layer.

According to the present invention, the high melting temperature metal layer of a material such as molybdenum silicide MoSi improves light shielding efficiency, and the second insulating layer having ample thickness serves as a buffer layer and suppresses stresses in the semiconductor layer from the high melting temperature metal layer.

As will be appreciated from the above, the present invention can prevent occurrence of a smear phenomenon by improving light shielding efficiency.

BRIEF DESCRIPTION OF THE DRAWINGS

In the drawings:

FIG. 1 is a sectional view showing an embodiment of a solid state image sensing device according to this invention;

FIG. 1A is a sectional view showing the relationship between a photosensitive pixel area and a charge transfer area in the embodiment shown in FIG. 1;

FIGS. 2(a) through 2(d) are sectional views indicating progressive steps in one example of the method of manufacturing a solid state image sensing device according to this invention;

DETAILED DESCRIPTION OF THE INVENTION

Figure 3:
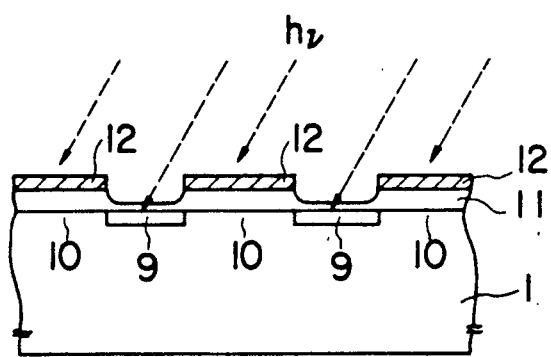
FIGS. 3, 5 and 6 are sectional views showing conventional solid state image sensing devices.

As conducive to a full understanding of this invention, the general nature, attendant problems, and limitations of a conventional solid state image sensing device and a method of manufacturing the same will first be described with reference to FIGS. 3 and 4, wherein each pixel is optically separated. Referring to FIG. 3, a photosensitive pixel area 9 and a charge transfer area 10 are formed on the surface of a semiconductor substrate 1. A light shielding layer 12 made of a aluminum Al or aluminum silicide Al-Si is formed above the charge transfer area 10 with an insulating layer 11 interposed therebetween.

Figure 4:
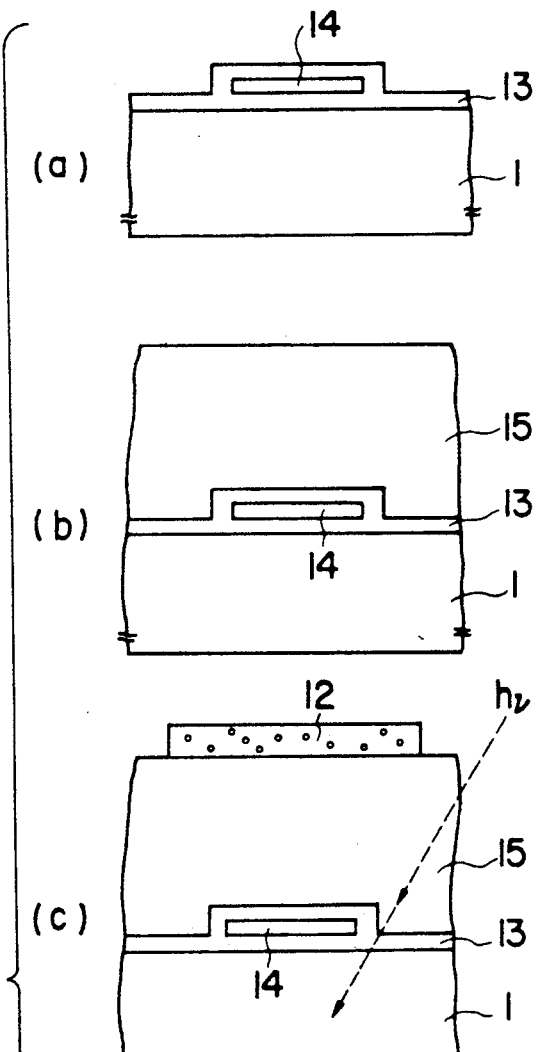
FIGS. 4(a) through 4(c) and 7(a) through 7(d) are sectional views indicating progressive steps in a conventional method of manufacturing a solid state image sensing device.

Referring to FIG. 4, a photosensitive pixel area (not shown) and a charge transfer area (not shown) are formed on the surface of a semiconductor substrate 1, and thereafter, a transfer electrode 14 made of a polysilicon layer is so formed above the charge transfer area that an oxide film 13 formed on the semiconductor substrate 1 through thermal oxidation is interposed between the transfer electrode 14 and the surface of the semiconductor substrate 1. Further, an oxide film 13 is formed on the transfer electrode 14 through thermal oxidation (FIG. 4(a)). Next, an insulating layer 15 is deposited over the entire surface by means of a chemical vapor deposition (CVD) method, and thereafter, phosphorus P is diffused into the insulating layer 15 (FIG. 4(b)). A light shielding layer 12 made of aluminum Al or aluminum silicide Al-Si is formed on the insulating layer 15 above the transfer electrode 14 (FIG. 4(c)).

Figure 5:
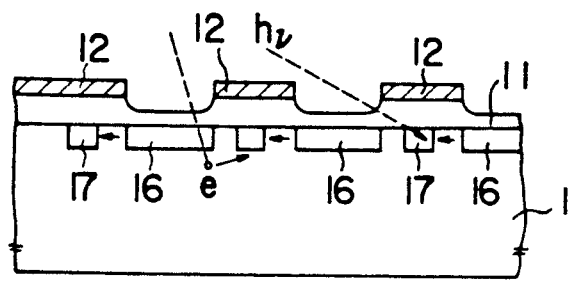

The above-described conventional image sensing device and the method of manufacturing the same, however, have insufficient optical separation of pixels by the light shielding layer 12. In the case of a charge coupled device (CCD) type solid image sensing device in particular, oblique rays of light are applied to areas other than a light receiving area 16 of a photosensitive pixel concerned so that light-induced charges are generated directly in the charge transfer area 17 of an adjacent pixel or leaked into the charge transfer area 17 of another adjacent pixel, as shown in FIG. 5. The charges directly generated in or leaked into adjacent charge transfer areas 17 pose the problem of a smear phenomenon.

Figure 6:
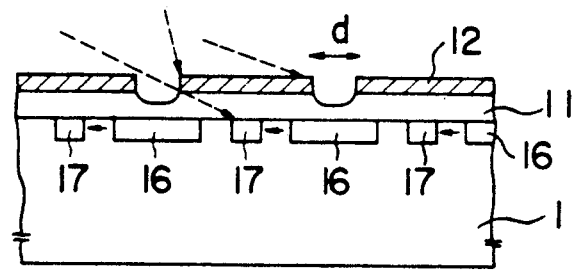

To solve this problem, the size of the light shielding layer 12 has been controlled heretofore to make the light incident aperture small, as shown in FIG. 6. However, this poses another problem of insufficient sensitivity because the sensitivity is proportional to the size of the light incident aperture.

Figure 7:
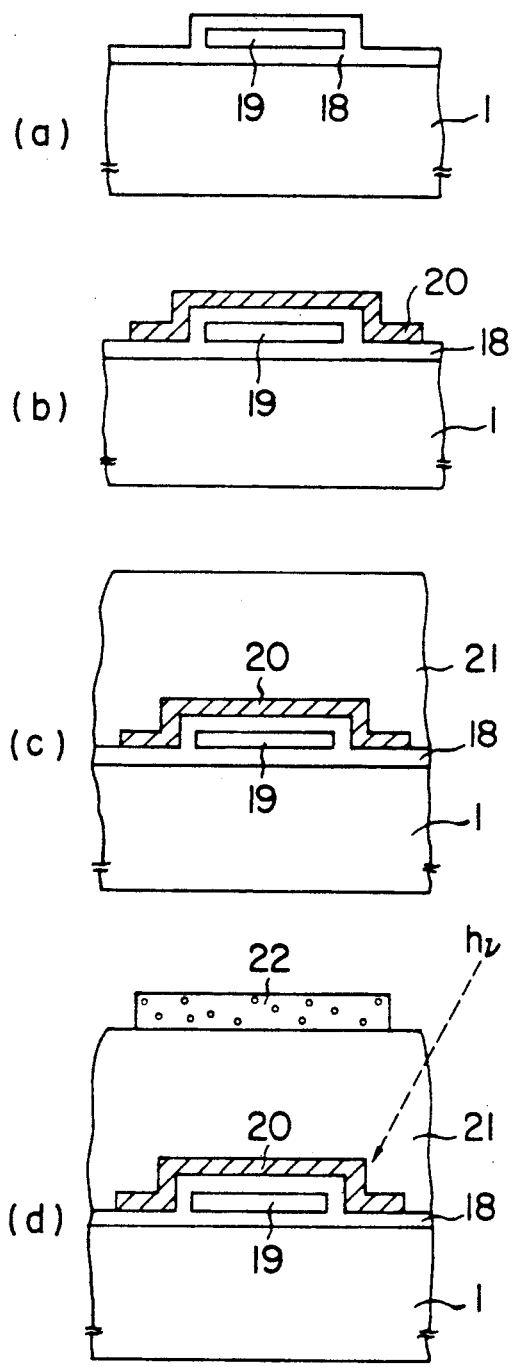

In view of the above, it has been proposed to provide a high melting temperature metal layer between the light shielding layer and the transfer electrode. The method of manufacturing such a solid state image sensing device will be described with reference to FIG. 7. A photosensitive pixel area (not shown) and a charge transfer area (not shown) are formed on the surface of a semiconductor substrate 1 and thereafter, a transfer electrode 19 made of a polysilicon layer is so formed above the charge transfer area that an oxide film 18 formed on the semiconductor substrate 1 through thermal oxidation is interposed between the transfer electrode 19 and the surface of the semiconductor substrate 1. Further, an oxide film 18 is formed on the transfer electrode 19 through thermal oxidation (FIG. 7(a)). Next, a high melting point metal layer 20 made of molybdenum silicide MoSi is formed on the oxide film 18 so as to cover the transfer electrode 19 (FIG. 7(b)). An insulating layer 21 is deposited over the entire surface and thereafter, phosphorus P is diffused into the insulating layer 21 (FIG. 7(c)). A light shielding layer 22 made of aluminum Al or aluminum silicide Al-Si is formed on the insulating layer 21 above the transfer electrode 19 (FIG. 7(c)).

Solid state image sensing devices manufactured according to the above method, however, pose a problem of "white scratch" defects due to etching damages during the formation of the high melting temperature metal layer 20 made of molybdenum silicide MoSi and due to stresses of or contamination diffusion into the semiconductor substrate 1 from the high melting temperature metal layer 20 made of molybdenum silicide MoSi.

As described above, conventional solid state image sensing devices are accompanied by the problem of smear phenomenon due to oblique incident lights or the like. Suppressing the smear phenomenon with the conventional methods produces other problems such as insufficient sensitivity and "white scratch" defects.

The present invention has been made in view of the above circumstances, and it is an object of the present invention to provide a solid state image sensing device and a method of manufacturing the same capable of preventing occurrence of the smear phenomenon by improving light shielding efficiency without entailing insufficient sensitivity and "white scratch" defects.

A sectional view of an embodiment of a solid state image sensing device according to this invention is shown in FIG. 1. A photosensitive pixel area (not shown) and a charge transfer area (not shown) are formed on the surface of a semiconductor substrate 1, as described in detail later. An oxide film 2 is formed over the entire surface of the semiconductor substrate 1 through thermal oxidation, and a transfer electrode 3 of polysilicon is formed on the oxide film 2 above the charge transfer area. An oxide film 4 having ample thickness is deposited over the entire surface of the oxide film 2 by a CVD method. The ample thickness of the oxide layer 4 as a first insulating layer means a sufficient thickness to prevent any stress of the high melting temperature metal layer 6 as a first light shielding layer. The layer 6 has such high stress because it is made of metal. This stress causes the semiconductor substrate to generate crystal defects, and so on. Accordingly, the thickness of the layer 4 is determined to lessen the stress.

Furthermore, the high melting temperature metal has a large content of heavy metal or the like. The heavy metal diffuses into the semiconductor substrate and causes the characteristic distortion and crystal defects. This thickness is sufficient to prevent the heavy metal diffusion. A getter layer 5 is formed at the surface of the oxide film 4 by diffusing phosphorus. A high melting temperature metal layer 6 of molybdenum silicide MoSi is formed on the oxide film 4 above the charge transfer area so as to cover the transfer electrode. It is to be noted that the thermal history of the high melting temperature metal layer 6 of molybdenum silicide MoSi need not be considered during the manufacturing process, so that it can be amply formed near the semiconductor substrate 1 as compared with a light shielding layer 8 of, e.g., aluminum Al or aluminum silicide AlSi. The light shielding layer 8 of aluminum Al or aluminum silicide AlSi is formed on an oxide film 7 above the high melting temperature layer 6.

Next, there is described in detail a positional relationship between the photosensitive pixel area and the charge transfer area, with reference to FIG. 1A. In FIG. 1A, numeral 9 denotes the photosensitive pixel area and numeral 10 denotes the charge transfer area. The areas 9 and 10 are formed on the surface of the semiconductor substrate 1. The transfer electrode 3 is formed on the charge transfer area 10 through the oxide film 2, and the (second) light shielding layer 8 is formed above the electrode 3 through the oxide film 7. On the other hand, the photosensitive pixel area 9 is constructed in a manner so that the incident rays pass through an insulation layer such as the oxide film having a high transmission factor of light without an interruption by the transfer electrode 3 and the light shielding layer 8.

In the above described example, the high melting temperature layer 6 is formed near the semiconductor substrate 1 under the light shielding layer 8 of aluminum Al or aluminum silicide AlSi, so that oblique light rays which cannot be shielded out by the light shielding layer 8 can be shielded out by the high melting temperature metal layer 6 thereby to improve the light shielding efficiency. As a result, the device performance can be improved, and particularly occurrence of the smear phenomenon can be prevented.

Further, since the high melting temperature metal layer 6 is a metal, it has a high stress, whereby crystal defects or the like may occur on the surface of the semiconductor substrate 1, thus resulting in poor performance of the solid state image sensing device. However, according to the present example, the oxide film 4 having ample thickness and serving as a buffer layer is formed between the high melting temperature metal layer 6 and the semiconductor substrate 1 so that the buffer function thereof can suppress occurrence of poor performance due to stresses in the semiconductor substrate 1 from the high melting temperature metal layer 6. Occurrence of poor performance due to etching damages during forming of the high melting temperature metal layer 6 can also be suppressed. Furthermore, contamination diffusion can also be suppressed.

Still further, phosphorus is added to the oxide film 4 serving as a buffer layer, so that a getter function thereof against contaminated impurities prevents deterioration of the device performance.

Next, an example of the method of manufacturing a solid state image sensing device according to this invention will be described with reference to FIG. 2. A photosensitive pixel area (not shown) and a charge transfer area (not shown) are formed on the surface of a semiconductor substrate 1, and thereafter an oxide film 2 is formed over the entire surface of the semiconductor substrate 1 through thermal oxidation. A transfer electrode 3 is then formed on the oxide film 2 above the charge transfer area (FIG. 2(a)).

Next, an oxide film 4 having ample thickness is formed over the entire surface by means of a CVD method. The film thickness was set at 3,000 angstroms or more, preferably in the range of 4000 to 6000 angstroms. After the oxide film 4 is formed, phosphorus is diffused therein to form a getter layer 5 on the surface thereof. If necessary, a Boro-Phosph-Silicate Glass (BPSG) layer may be additionally deposited on the oxide film 4. A high melting temperature metal layer 6 made of molybdenum silicide MoSi is formed on the oxide film 4 above the charge transfer area to cover the transfer electrode 3 (FIG. 2(b)).

Next, an oxide film 7 is formed over the high melting temperature metal layer 6 by means of a CVD method, and thereafter phosphorus is diffused into the oxide film 7 (FIG. 2(c)). A light shielding layer 8 made of, e.g., aluminum Al or aluminum silicide AlSi is formed on the oxide film 7 above the high melting temperature metal layer 6 (FIG. 2(d)).

According to the above-described example, it is not necessary to consider the thermal history of the high melting temperature metal layer 6 of molybdenum silicide MoSi during the manufacturing processes, so that it can be formed amply near the semiconductor substrate 1 as compared with the light shielding layer 8 of, e.g., aluminum Al or aluminum silicide AlSi. Therefore, oblique light rays which cannot be shielded out by the light shielding layer 8 can be shielded out by the high melting temperature metal layer 6 to thus improve the light shielding efficiency. As a result, the device performance can be improved, and particularly occurrence of the smear phenomenon can be prevented.

Further, the oxide film 4 having ample thickness and serving as a buffer layer is formed between the high melting temperature metal layer 6 and the semiconductor substrate 1, so that the buffer function thereof can suppress occurrence of poor performance due to stresses in the semiconductor substrate 1 from the high melting temperature metal layer 6. Occurrence of poor performance due to etching damages during forming of the high melting temperature metal layer 6 can also be suppressed. Furthermore, contamination diffusion can also be suppressed.

Still further, phosphorus P is added to the oxide film 4 serving as a buffer layer to form the getter layer 5 on the surface thereof through thermal oxidation. Therefore a getter function can operate against contamination during forming of the high melting temperature metal layer 6. The getter function against contaminated impurities can be further enhanced through phosphorus diffusion into not only the oxide film 4 but also the oxide film 7 on the high melting temperature metal layer 6.

The invention is not intended to be limited to the examples thereof described with and shown in the figures but may include various modifications thereof. For instance, besides molybdenum silicide MoSi, titanium silicide TiSi or tungsten silicide WSi can be used as the high melting temperature metal.

What is claimed is:

1. A solid state image sensing device comprising;
 a semiconductor substrate;
 a photosensitive pixel area disposed on the semiconductor substrate for generating signal charges in response to incident light and for storing the signal charges;
 a charge transfer area disposed adjacent to the photosensitive pixel area for transferring the signal charges stored in the photosensitive pixel area;
 a transfer electrode provided above the charge transfer area;
 a high melting temperature metal layer serving as a first light shielding layer which is formed above said transfer electrode; and
 a first insulating layer which is formed between said high melting temperature metal layer and said transfer electrode and having a thickness sufficient to prevent crystal defects, radiation damages and any heavy metal diffusion of said metal layer; and
 a getting layer, provided between said first insulating layer and said high melting temperature metal layer, formed by a thermal diffusion of phosphorous.

2. A solid state image sensing device according to claim 1, wherein said high melting temperature metal layer is composed of molybdenum silicide.

3. A solid state image sensing device according to claim 2, wherein said insulating layer is formed from an oxide film with phosphorus added therein.

4. A solid state image sensing device according to claim 1, wherein said insulating layer is formed from an oxide film with phosphorus added therein.

5. A solid state image sensing device according to claim 1, wherein said getter layer has sufficient thickness to absorb said heavy metal impurities.

6. A solid state image sensing device according to claim 1, further comprising a second light shielding layer which is formed above said transfer electrode.

7. A solid state image sensing device according to claim 6, further comprising a second insulating layer which is formed on said getter layer and said high melting temperature metal layer, said second light shielding layer being formed on said second insulating layer.

* * * * *